(12) United States Patent  
Kitazawa

(10) Patent No.: US 7,663,655 B2
(45) Date of Patent: Feb. 16, 2010

(54) LIGHT-EMITTING DEVICE AND IMAGE FORMING APPARATUS

(75) Inventor: Takayuki Kitazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/222,704

(22) Filed: Aug. 14, 2008

(65) Prior Publication Data

US 2009/0002473 A1   Jan. 1, 2009

Related U.S. Application Data

(60) Continuation of application No. 12/155,446, filed on Jun. 4, 2008, which is a division of application No. 11/113,192, filed on Apr. 25, 2005, now Pat. No. 7,397,491.

(30) Foreign Application Priority Data

Jul. 27, 2004   (JP) .............................. 2004-218272
Feb. 25, 2005   (JP) .............................. 2005-050324

(51) Int. Cl.
      *B41J 2/435*   (2006.01)
(52) U.S. Cl. ..................................... 347/237
(58) Field of Classification Search .............. 347/130, 347/237, 238
      See application file for complete search history.

(56) References Cited

U.S. PATENT DOCUMENTS 4,478,504 A    10/1984   Tanaka
6,307,322 B1   10/2001   Dawson et al.
6,535,235 B1   3/2003    Nagumo
6,936,846 B2   8/2005    Koyama et al.
7,126,268 B2   10/2006   Kitazawa
7,142,781 B2   11/2006   Koyama et al.
7,288,420 B1   10/2007   Yamazaki et al.
7,397,491 B2*  7/2008    Kitazawa .................... 347/237
2003/0214042 A1* 11/2003  Miyazawa ................... 257/758

FOREIGN PATENT DOCUMENTS

| JP | A-04-363264   | 12/1992 |
| JP | A-05-057953   | 3/1993  |
| JP | A-2002-006777 | 1/2002  |
| JP | A-2002-287665 | 10/2002 |
| JP | A-2003-007722 | 1/2003  |
| JP | A-2003-150079 | 5/2003  |

* cited by examiner

*Primary Examiner*—Huan H Tran
(74) *Attorney, Agent, or Firm*—Oliff & Berridge, PLC

(57) ABSTRACT

A light-emitting device has a plurality of pixel circuits arranged in one direction, each of the plurality of pixel circuits having a light-emitting element that emits light according to the amount of driving current, a driving transistor that supplies the driving current to the light-emitting element, a holding transistor that supplies a data signal supplied via a data line to the driving transistor, and a connecting line that connects the driving transistor to the holding transistor. The holding transistor, the light-emitting element, and the driving transistor are arranged in a direction crossing the arrangement direction of the plurality of pixel circuits. The light-emitting element is provided between the holding transistor and the driving transistor.

2 Claims, 11 Drawing Sheets

LIGHT-EMITTING DEVICE AND IMAGE FORMING APPARATUS

This is a continuation application of U.S. patent application Ser. No. 12/155,446 filed Jun. 4, 2008, which in turn is a divisional application of U.S. patent application Ser. No. 11/113,192, filed on Apr. 25, 2005 and claims priority to Japanese patent application nos. 2004-218272 and 2005-050324, filed Jul. 27, 2004 and Feb. 25, 2005, respectively. The entire disclosures of the prior applications are hereby incorporated by reference herein in their entirety.

BACKGROUND

1. Technical Field

The present invention relates to a light-emitting device having a light-emitting element which emits light according to the amount of current flowing from an anode to a cathode, such as an organic light-emitting diode element, and an image forming apparatus.

2. Related Art

In recent years, organic electroluminescent elements or organic light-emitting diode (OLED) elements, which are also referred to as light-emitting polymer elements, have been attracting much attention as next-generation light-emitting devices to replace liquid crystal devices. Image forming apparatuses having a line head, as an exposure unit, in which a plurality of OLED elements are provided for each line, have been developed. In the above-described line head, in addition to the OLED elements, a plurality of pixel circuits respectively having transistors for driving the OLED elements are arranged. For example, in Japanese Unexamined patent Application Publication No. 4-363264, a line head in which the OLED elements are provided in one line is disclosed.

However, the resolution of a printer depends on the pitch of the pixel circuits, and the luminance of the line head depends on the area of each OLED element. For this reason, it is important to optimally arrange elements constituting each pixel circuit. Further, impedance of power line is preferably low.

SUMMARY

An advantage of the invention is that it provides a light-emitting device which can reduce the pitch of pixel circuits, and an image forming apparatus using the same.

According to a first aspect of the invention, a light-emitting device includes a plurality of pixel circuits arranged in one direction, each of the plurality of pixel circuits including a light-emitting element that emits light according to the amount of driving current, a driving transistor that supplies the driving current to the light-emitting element, a holding transistor that supplies a data signal supplied via a data line to the driving transistor, and a connecting line that connects the driving transistor to the holding transistor. The holding transistor, the light-emitting element, and the driving transistor are arranged in a direction crossing the arrangement direction of the pixel circuits, and the light-emitting element is provided between the holding transistor and the driving transistor.

In accordance with the first aspect of the invention, since the holding transistor, the light-emitting element, and the driving transistor are sequentially arranged in the pixel circuit, the pitch between the pixel circuits can be narrowed and resolution can be enhanced.

Further, it is preferable that the driving transistor is supplied with a first power supply voltage via a first power line, the light-emitting element has a first electrode connected to the driving transistor and a second electrode to which a second power supply voltage is supplied via a second power line, and the first power line and the second power line are provided at a driving transistor side outside a region where the plurality of pixel circuits are formed. According to this layout, since the first power line and the second power line are arranged near the driving transistors, useless wiring lines which do not involve in power supply can be removed. As a result, the pixel circuit having a small area can be constructed.

It is preferable that the light-emitting elements in adjacent pixel circuits are arranged in a zigzag manner. In order to increase light-emitting luminance of the light-emitting element, it is necessary to enlarge the area of the light-emitting element. When the light-emitting elements are arranged in the zigzag manner, the area of the light-emitting element can be enlarged and the light-emitting element that emits light with high luminance can be formed.

Further, it is preferable that a length of the light-emitting element in the arrangement direction of the plurality of pixel circuits is longer than a pitch between the pixel circuits. In this case, since the light-emitting elements having large areas are arranged in the zigzag manner, the light-emitting luminance can be increased and the pitch between the pixel circuits can be narrowed. As a result, the resolution of the light-emitting device can be enhanced.

It is preferable that the driving transistor and the light-emitting element have a laminated structure having a plurality of layers, the plurality of layers including a first layer line, a second layer line, a third layer line constituting the second electrode, a first interlayer insulating layer provided between the first layer line and the second layer line, and a second interlayer insulating layer provided between the second layer line and the third layer line. The first power line may be formed with the first layer line and the second layer line and the second power line may be formed with the second layer line and the third layer line. In this case, since each of the first power line and the second power line has a two-layered structure, impedance of power line can be reduced. Further, since the second layer line is used for both of the first power line and the second power line, a chip area can be reduced. Moreover, in intersections of the first power line and the second power line, the second layer line may be removed from any one of the first power line and the second power line.

It is preferable that the driving transistor and the light-emitting element have a laminated structure having a plurality of layers, the plurality of layers including a first layer line, a second layer line, a third layer line constituting the second electrode, a fourth layer line constituting the first electrode, a first interlayer insulating layer provided between the first layer line and the second layer line, and a second interlayer insulating layer provided between the second layer line and the third layer line. The first power line may be formed with the first layer line and the second layer line and the second power line may be formed with the second layer line, the third layer line, and the fourth layer line. In this case, since each of the first power line and the second power line has a two-layered structure, the impedance of power line can be reduced. Further, since the second layer line is used for both of the first power line and the second power line, it is unnecessary to provide an additional layer to make the power line of the laminated structure. Accordingly, the structure can be simplified.

Further, it is preferable that the first electrode is an anode of the light-emitting element and the second electrode is a cathode of the light-emitting element. In this case, for example, it is preferable that the holding transistor is a p-channel TFT and the driving transistor is an n-channel transistor. Then, a high-potential-side voltage is supplied to a source of the driving transistor, whose drain is connected to the anode of the light-emitting element, and a low-potential-side voltage is supplied to the cathode of the light-emitting element.

Further, the above-described light-emitting device may further include a plurality of data lines that are provided in a direction parallel to the arrangement direction of the plurality of pixel circuits and that are connected to the plurality of pixel circuits, respectively; a substrate that has a first end surface and a second end surface and on which the plurality of data lines, the holding transistors, the light-emitting elements, the driving transistors, the first power line, and the second power line are sequentially formed between the first end surface and the second end surface; and a sealing member that is connected to the substrate to cover the holding transistors, the light-emitting elements, the driving transistors, the second power line, and the first power line.

Generally, when the light-emitting element comes in contact with oxygen, performance deteriorates. Therefore, a sealing structure is used for the purpose of blocking external air and protecting internal circuits. As the sealing structure, a can sealing structure, a thin film sealing structure, a substrate bonding structure, and the like have been known. However, even though any structure is used, actually, external gas penetrates into the sealing structure. For the reason, it is preferable to form the light-emitting element near a center of the substrate. In accordance with the first aspect of the invention, since the plurality of data lines, the holding transistors, the light-emitting elements, the driving transistors, and the power lines are sequentially formed on the substrate, the light-emitting elements can be disposed near the center of the substrate. Accordingly, reliability of the light-emitting device can be enhanced.

Further, the above-described light-emitting device may further include a plurality of data lines that are provided in a direction parallel to the arrangement direction of the plurality of pixel circuits and that are connected to the plurality of pixel circuits, respectively; a substrate that has a first end surface and a second end surface and on which the plurality of data lines, the holding transistors, the light-emitting elements, the driving transistors, the first power line, and the second power line are sequentially formed between the first end surface and the second end surface; and a sealing member that is connected to the substrate to cover the holding transistors, the light-emitting elements, the driving transistors, the second power line, and the first power line. The first electrode may be an anode of the light-emitting element and the second electrode may be a cathode of the light-emitting element. Since the cathode easily reacts to oxygen, the cathode is preferably disposed at the central portion of the substrate, if possible. In accordance with the first aspect of the invention, since the second power line connected to the cathode is spaced from the second end surface farther than the first power line and is arranged around the center, the cathode can be further disposed at the center. Accordingly, reliability of the light-emitting device can be further enhanced.

According to a second aspect of the invention, an image forming apparatus includes a photoreceptor onto which light rays are irradiated to form an image and a head unit that irradiates the light rays onto the photoreceptor to form the image. The above-described light-emitting device may be used as the head unit. As described above, the light-emitting device has the narrow pitch between the pixel circuits and emits light with high luminance. As a result, the image can be formed on the photoreceptor with high resolution.

BRIEF DESCRIPTION OF THE DRAWINGS

The invention will be described with reference to the accompanying drawings, wherein like numbers reference like elements, and wherein.

DETAILED DESCRIPTION OF EMBODIMENTS

Hereinafter, an embodiment according to the invention will be described with reference to the drawings.

Light-Emitting Device

Figure 1:
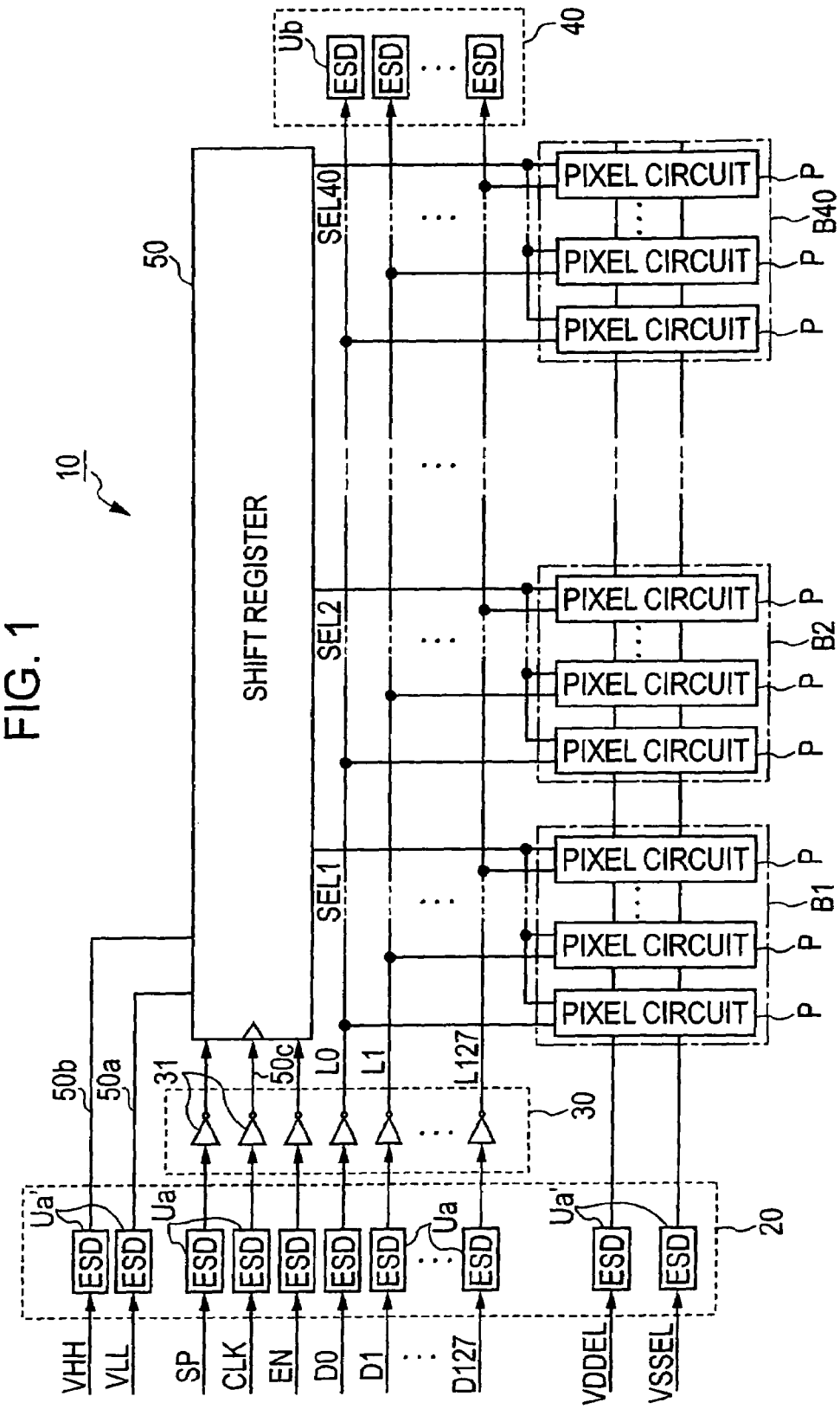
FIG. 1 is a block diagram showing a configuration of a light-emitting device of the invention.

FIG. 1 is a block diagram showing the configuration of a light-emitting device according to an embodiment of the invention. The light-emitting device is used as a head unit 10 of a printer, which is an example of an image forming apparatus. The head unit 10 is a linear optical head and has an input protection circuit 20, a buffer unit 30, 128 data lines L0 to L127, an output protection circuit 40, a shift register 50, and pixel blocks B1 to B40. The head unit 10 is provided with various control signals and power signals, as well as data signals D0 to D127. The input protection circuit 20 has a plurality of input electrostatic discharge (ESD) protection units Ua that are provided on wiring lines supplying the control signals and inter-power-supply protection units Ua' that are provided between a plurality of power supplies supplying the power signals. As the control signals, a shift pulse signal SP, a clock signal CLK, and an enable signal EN are included. The buffer unit 30 has a plurality of inverters 31, serves as a driver which supplies the data signals D0 to D127 to the data lines L0 to L127, and converts each control signal into a signal with low impedance to supply the converted control signal to the shift register 50.

The shift pulse signal SP is a pulse which becomes active when a main scanning period is started. The enable signal EN is a signal which allows selection signals SEL1 to SEL40 to be outputted from the shift register 50. The shift register 50 is supplied with power supply voltage signals VHH and VLL. The power supply voltage signal VHH is supplied via a wiring line 50b and the power supply voltage signal VLL is supplied via a wiring line 50a. When the enable signal EN is in an active state, the shift register 50 shifts the shift pulse signal SP according to the clock signal CLK and sequentially outputs the selection signals SEL1 to SEL40. Each of the selection signals SEL1 to SEL40 becomes active in a period corresponding to one fortieth of the main scanning period. Further, the clock signal CLK is supplied to the shift register 50 via a wiring line 50c.

The first to fortieth blocks B1 to B40 are selected sequentially and exclusively by the selection signals SEL1 to SEL40. In such a manner, since the main scanning period is divided into a plurality of selection periods (writing periods) for time-division driving, the number of data lines L0 to L127 can be reduced. Each of the first to fortieth pixel blocks B1 to B40 has 128 pixel circuits P corresponding to the data lines L0 to L127 respectively. These pixel circuits P are supplied with a first power supply voltage signal VDDEL and a second power supply voltage signal VSSEL. Then, the data signals D0 to D127, which are supplied via the data lines L0 to L127 during the respective selection periods, are loaded into the pixel circuits P. Moreover, in the present embodiment, the data signals D0 to D127 are binary signals which instruct turning on or off of the OLED elements.

Figure 2:
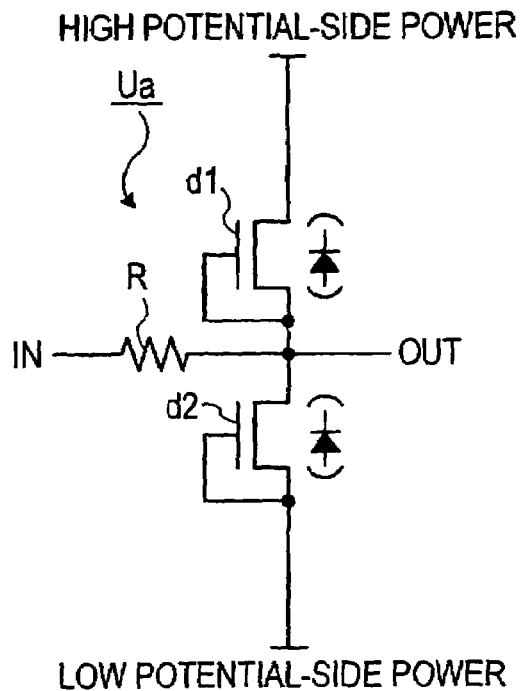
FIG. 2 is a circuit diagram showing an input electrostatic discharge (ESD) protection unit of the light-emitting device.
Figure 3:
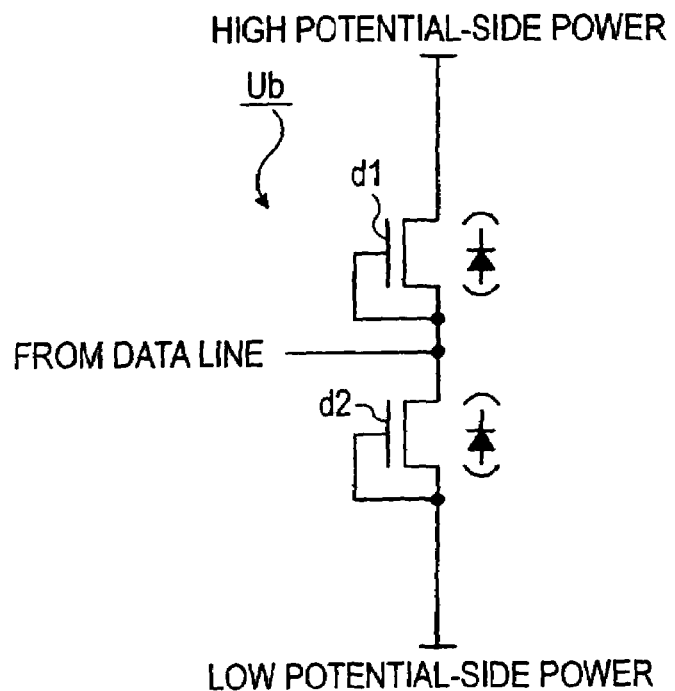
FIG. 3 is a circuit diagram showing an output ESD protection unit of the light-emitting device.

FIG. 2 is a circuit diagram of the input ESD protection unit Ua used for the input protection circuit 20, and FIG. 3 is a circuit diagram of the output ESD protection unit Ub used for the output protection circuit 40. In the input ESD protection unit Ua and the output ESD protection unit Ub, diodes d1 and d2 are connected in series between a high-potential-side power and a low-potential-side power. Further, in the input ESD protection unit Ua, a resistor R is provided. Moreover, the inter-power-supply protection unit Ua' is constituted by connecting a diode in a reverse direction between the power lines. In the present embodiment, since the head unit 10 corresponds to the vertical printing size of an A4 sheet, the length of each of the data lines L0 to L127 is about 215 mm. Accordingly, the protection circuits are provided at an input end and an output end of each of the data lines L0 to L127 as a countermeasure against electrostatic discharge. For the same reason, the protection circuit is provided at a power supply side as a countermeasure against electrostatic discharge. Besides, the buffer unit 30 is provided in the head unit 10. This is because the input ESD protection unit Ua has the resistor R. When the head unit 10 is externally driven without providing the buffer unit 30, the delay time of the signals may be increased.

Figure 4:
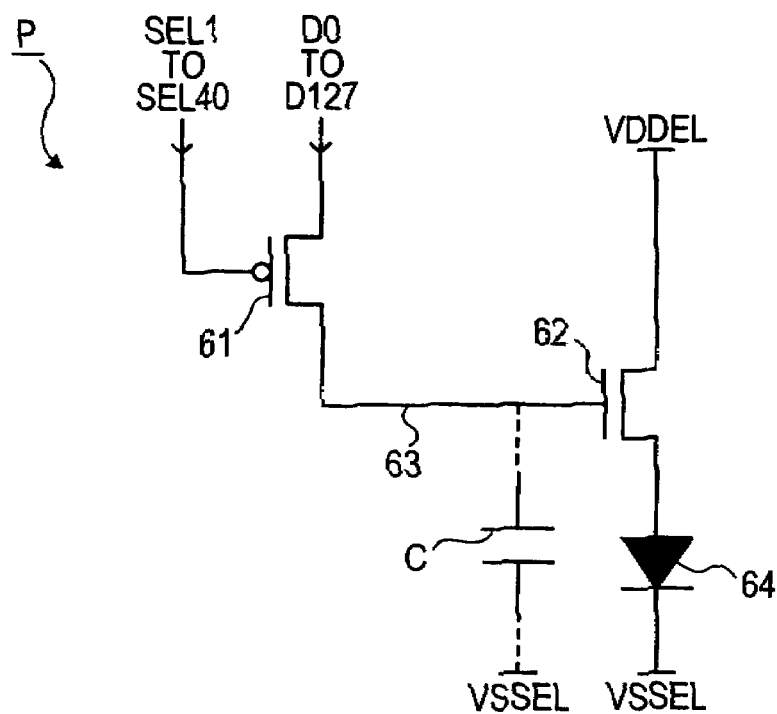
FIG. 4 is a circuit diagram of a pixel circuit the light-emitting device.

FIG. 4 is a circuit diagram of the pixel circuit P. The pixel circuit P has a holding transistor 61, a driving transistor 62, and an OLED element 64. Any one of the selection signals SEL1 to SEL40 is supplied to the holding transistor 61 from the shift register 50. Any one of the data signals D0 to D127 is supplied to a source of the protecting transistor 61 which is connected to any one of the data lines L0 to L127. A drain of the holding transistor 61 and a gate of the driving transistor 62 are connected to each other by a connecting line 63. As described later, the connecting line 63 has an associated parasitic capacitance which functions as a storage capacitor C. A binary voltage is written into the storage capacitor C during the selection period and the written voltage is held until the next selection period. Thus, in a period when the holding transistor is selected by one of the selection signals SEL1 to SEL40, the OLED element 64 emits light only in a period when one of the data signals D0 to D127 is the signal which instructs turning on of the OLED element 64.

Figure 5:
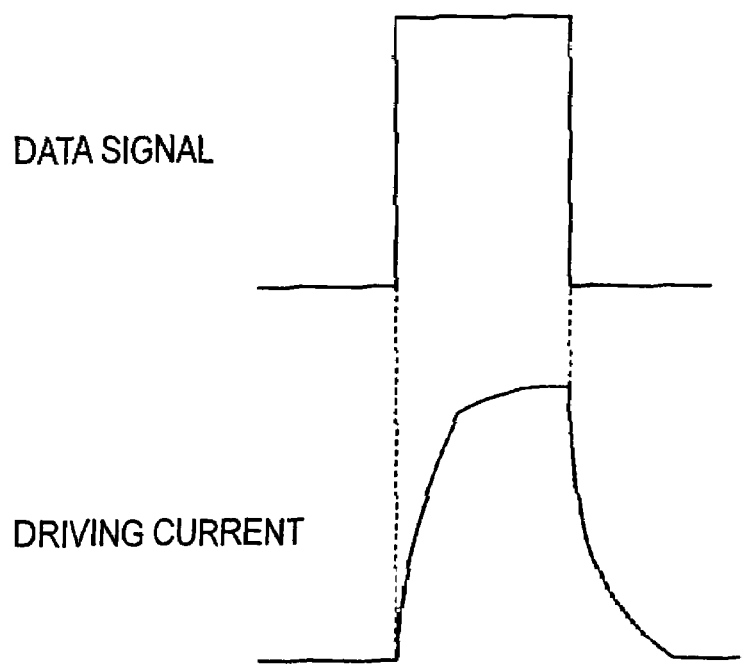
FIG. 5 is a waveform diagram showing the relationship between a data signal and a driving current.

The first power supply voltage signal VDDEL is supplied to a drain of the driving transistor 62, and an anode of the OLED element is connected to a source of the driving transistor 62. The driving transistor 62 supplies a driving current according to the voltage written into the storage capacitor C to the OLED element 64. The second power supply voltage signal VSSEL is supplied to a cathode of the OLED element 64. The OLED element 64 emits light with an intensity according to the value of the driving current. In the pixel circuit P of the present embodiment, the holding transistor 61 is a P-channel TFT (thin film transistor) and the driving transistor 62 is an N-channel TFT. Since the P-channel TFT is excellent in receiving a current, as shown in FIG. 5, the rising waveform of the driving current is steep and the falling waveform of the driving current is gentle. As a result, gray-scale characteristics of the OLED element 64 at the time of a low gray-scale level are degraded, but peak luminance can be increased. Since the sensitivity of a photoreceptor is generally low, it is important to increase the peak luminance. On the other hand, when the OLED element 64 emits light corresponding to a threshold current, there is no adverse effect on image quality since the sensitivity of the photoreceptor is very low. Accordingly, considering the peak luminance, preferably, the holding transistor 61 is the P-channel transistor and the driving transistor 62 is the N-channel transistor.

Figure 6:
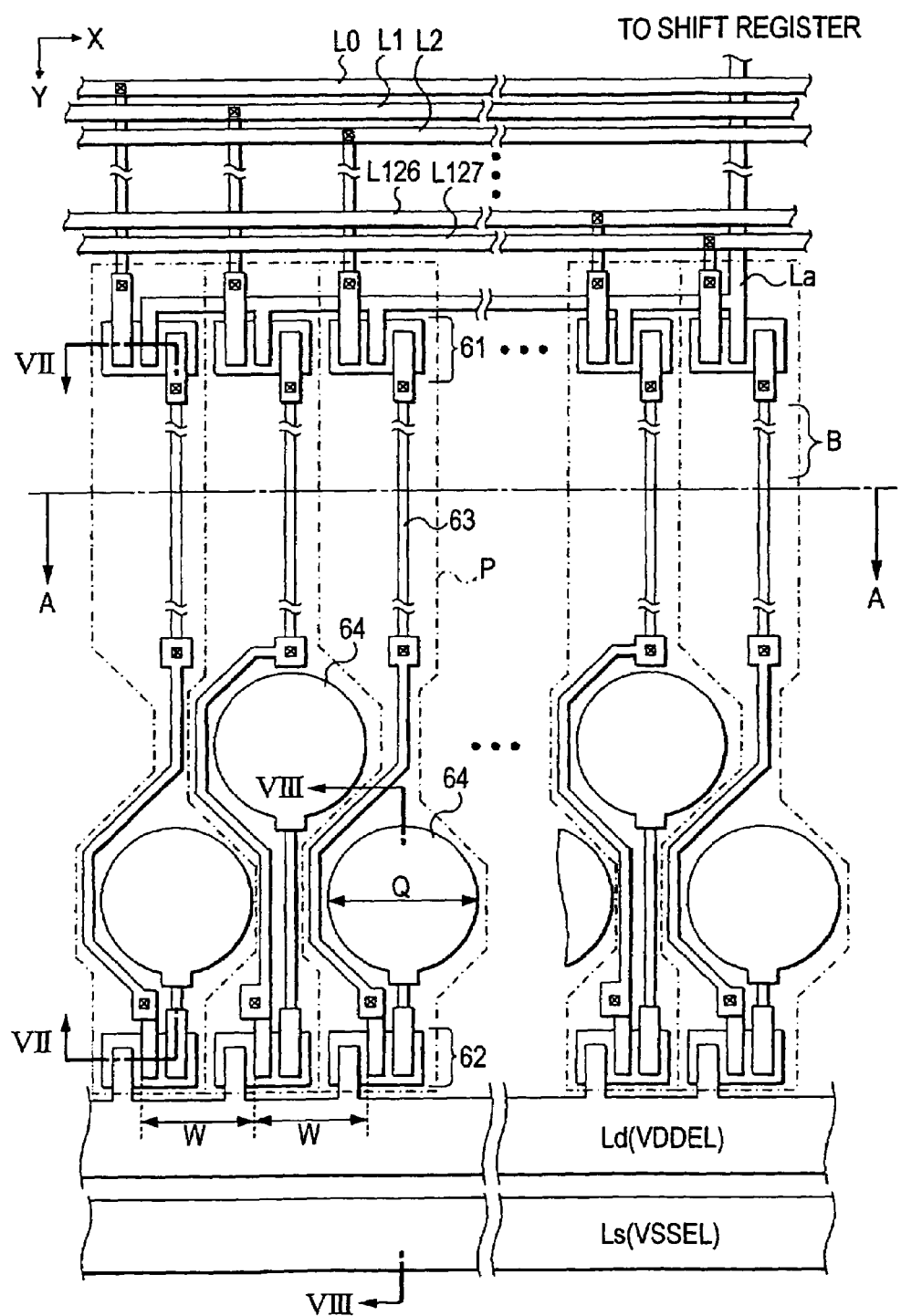
FIG. 6 is a plan view showing wiring structures of a pixel block and a data line.

FIG. 6 shows wiring structures of the pixel block and the data line. As shown in FIG. 6, the data lines L0 to L127 are arranged parallel to each other in an X direction (an arrangement direction of the pixel circuits P). In addition, the plurality of pixel circuits P are arranged in the X direction. Each pixel circuit P has the holding transistor 61, the driving transistor 62, the connecting line 63, and the OLED element 64, which are arranged in a Y direction (a direction orthogonal to the arrangement direction of the pixel circuits P). Gates of the respective holding transistors 61 are connected in common by a wiring line La and are connected to the shift register 50. The data lines L0 to L127 are formed with source lines. A connecting line 60 using a gate line is used for connection between each holding transistor 61 and each of the data lines L0 to L127. The OLED element 64 is provided between the holding transistor 61 and the driving transistor 62. Further, the OLED elements 64 are arranged in a zigzag manner.

In the pixel circuit P, the holding transistor 61, the driving transistor 62, and the OLED element 64 have a large occupied area. Accordingly, by laying out these elements in the Y direction, a pitch W between the pixel circuits P can be narrowed. As a result, the resolution can be enhanced.

Since the sensitivity of a photoreceptor is generally low, it is important to increase light-emitting luminance in the head unit 10. The light-emitting luminance of the OLED element 64 is in proportion to the area thereof. However, the larger the area of the OLED element 64 is, the longer the pitch W of the pixel circuits P is. That is, there is a trade-off relationship between the light-emitting luminance and the resolution. In the present embodiment, since the OLED elements 64 are arranged in the zigzag manner, the length of the OLED element 64 becomes longer than the pitch W. As a result, the OLED elements 64 can emit light with high luminance and the resolution can be enhanced by narrowing the pitch W.

A first power line Ld and a second power line Ls are laid out near the driving transistor 62 of each of the pixel circuits P. Since the first power supply voltage signal VDDEL is supplied to the source of the driving transistor 62 via the first power line Ld, useless wiring lines can be removed by arranging the first power line Ld near the driving transistor 62.

Meanwhile, the second power supply voltage signal VSSEL is supplied to the cathode 645 (see FIG. 7) of the OLED element 64 via the second power line Ls.

Figure 7:
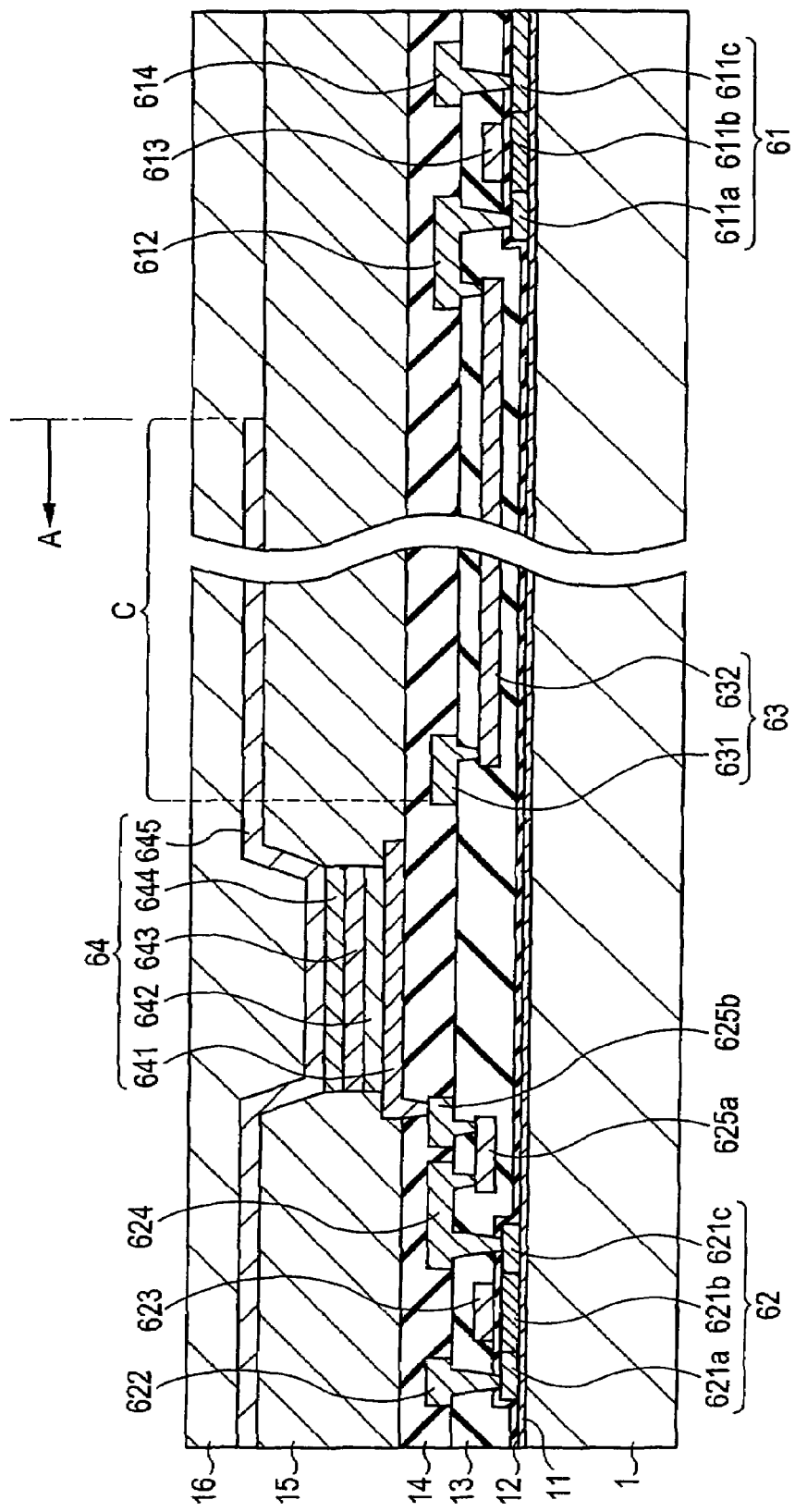
FIG. 7 is a cross-sectional view taken along the line Z1-Z1' of FIG. 6.

FIG. 7 is a cross-sectional view taken along the line Z1-Z1' of FIG. 6. The driving transistor 62 is provided on a surface of a substrate 1 via a base protective layer 11 mainly made of $SiO_2$. A silicon layer 621 is formed on an upper layer of the base protective layer 11. For this reason, the driving transistor 62 becomes the N-channel transistor. A gate insulating layer 12 is formed on the upper layer of the base protective layer 11 to cover the silicon layer 621. A gate electrode 623 is formed on a portion of the top surface of the gate insulating layer 12 which faces the silicon layer 621. Group-V elements are doped into the silicon layer 621 via the gate electrode 623 to form a drain region 621a and a source region 621c. Here, a region into which the group-V elements are not doped serves as a channel region 621b. A first interlayer insulating layer 13 is formed on the upper layer of the gate insulating layer 12 to cover the gate electrode 623. In addition, a drain electrode 622 is connected to the drain region 621a via a contact hole which passes through the gate insulating layer 12 and the first interlayer insulating layer 13. On the other hand, a source electrode 624 is formed at a location opposite to the drain electrode 622 with the gate electrode 623 interposed therebetween and is connected to the source region 621c via a contact hole which passes through the gate insulating layer 12 and the first interlayer insulating layer 13. A second interlayer insulating layer 14 is formed on the upper layer of the first interlayer insulating layer 13 to cover the drain electrode 622 and the source electrode 624.

Similarly, the holding transistor 61 has a silicon layer 611, the gate insulating layer 12, a gate electrode 613, the first interlayer insulating layer 13, a first drain/source electrode 612, and a second drain/source electrode 614. However, group-III elements are doped into the silicon layer 611 via the gate electrode 613 to form a first drain/source region 611a and a second drain/source region 611c. Here, a region into which the group-III elements are not doped serves as a channel region 611b. The holding transistor 61 becomes a P-channel transistor.

In addition, the gate electrode 623 of the driving transistor 62 is connected to the first drain/source electrode 612 of the holding transistor 61 via the connecting line 63. In the present embodiment, the connecting line 63 has a first wiring line 631 and a second wiring line 632 (see FIG. 7). The first wiring line 631 is formed with a wiring line which is formed in the same layer as the first drain/source electrode 612 and the second drain/source electrode 614 of the holding transistor 61 and the drain electrode 622 and the source electrode 624 of the driving transistor 62. The second wiring line 632 is formed with a wiring line formed in the same layer as the gate electrodes 623 and 613.

The OLED element 64 includes an anode 641, a hole transporting layer 642 capable of transporting holes, a light-emitting layer 643 including an organic EL material having light emission properties, an electron transporting layer 644 formed on the top surface of the light-emitting layer 643, and a cathode 645 formed on the top surface of the electron transporting layer 644. The anode 641 is connected to the source electrode 624 of the driving transistor 62 via a wiring line 625a and a wiring line 625b. In addition, the wiring line 625b may extend below the anode 641 and may be connected to the anode 641 via a contact hole to form an anode having a two-layered structure. Further, the wiring line 625a may extend below the anode 641 and may be connected the wiring line 625b via a contact hole to form an anode having a three-layered structure. In all cases, the impedance of the anode can be reduced.

In addition, a partition wall 15 made of synthetic resin or the like is formed between the cathode 645 and a portion of the surface of the first interlayer insulating layer 13 where the OLED element 64 is not formed. In addition, the partition wall 15 is formed to isolate the OLED elements 64 which are respectively provided for the driving transistors 62. The anode 641 has a function of supplying holes to the light-emitting layer 60 and is made of a transparent conductive material such as indium tin oxide (ITO), an indium oxide- or zinc oxide-based amorphous transparent conductive film (indium zinc oxide: IZO) (Registered Trademark), or the like. The anode 641 may include an alloy of the above-described materials or a laminate thereof. The cathode 645 is made of a metal element having a low work function (for example, an alkali metal, an alkali earth metal, magnesium, a rare earth element (excluding promethium (Pm)), and aluminum) in order to increase electron injection efficiency. In addition, the cathode 645 is preferably made of a light reflective or non-transparent conductive material. In the present embodiment, light from the light-emitting layer 643 is emitted from the anode 641 (a bottom emission type). However, light from the light-emitting layer 643 may be emitted from the cathode 645 (a top emission type).

Here, the cathode 645 is formed to cover a portion of the second insulating layer 14, not the entirety thereof. Specifically, the cathode 645 is formed in a region indicated by an arrow A shown in FIGS. 6 and 7, not in regions in which the data lines L0 to L127 and the holding transistor 61 are formed. In such a manner, when the cathode 645 does not overlap the data lines L0 to L127 or the holding transistor 61, the stray capacitance can be reduced. The data lines L0 to L127 are formed in the same manufacturing process as the first drain/source electrode 612 and second drain/source electrode 614 of the holding transistor 61 and the drain electrode 622 and source electrode 624 of the driving transistor 62. Accordingly, when the cathode 645 is formed to cover the entire surface of the second insulating layer 14, a stray capacitance occurs between the cathode 645 and the data lines L0 to L127. Since the light-emitting device of the present embodiment is used as the head unit 10 of a printer, the length of each of the data lines L0 to L127 is long and thus the stray capacitance is large. A load when viewed from the buffer unit 30 becomes larger due to the stray capacitance. Therefore, the cathode 645 is not formed in the region corresponding to the data lines L0 to L127. Therefore, the data signals D0 to D127 can be reliably written during the limited selection period. Further, the delay time of each of the data signals D0 to D127 can be drastically reduced.

On the other hand, since the cathode 645 faces a portion of the connecting line 63, the stray capacitance occurs between them. The stray capacitance forms the storage capacitor C. In the selection period, the holding transistor 61 is turned on and the data signal is written into the storage capacitor C. When the selection period ends, the holding transistor 61 is turned off, while the voltage of the data signal is held in the storage capacitor C. Accordingly, the driving transistor 62 can supply a predetermined current to the OLED element 64 even in a period from the end of one selection period up to the start of the next selection period. In the present embodiment, the cathode 645 faces the portion of the connecting line 63. However, the amount of overlap of the cathode 645 and the connecting line 63 depends on the value of the storage capacitor C, which is determined by the length of the storage period and the like. Accordingly, the cathode 645 may face the entire portion of the connecting line 63.

Moreover, a resistive element may be provided on the connecting line 63 in order to remove noise. In this case, it is preferable to provide the resistive element in a region B shown in FIG. 6. That is, the resistive element is provided in a region where the connecting line 63 does not face the cathode 645. When the resistive element is formed in a region A where the connecting line 63 faces the cathode 645, the value of the storage capacitor C is reduced. Therefore, when the resistive element is formed in the region where the connecting line 63 does not face the cathode 645, the storage capacitor C can be efficiently formed.

Figure 8:
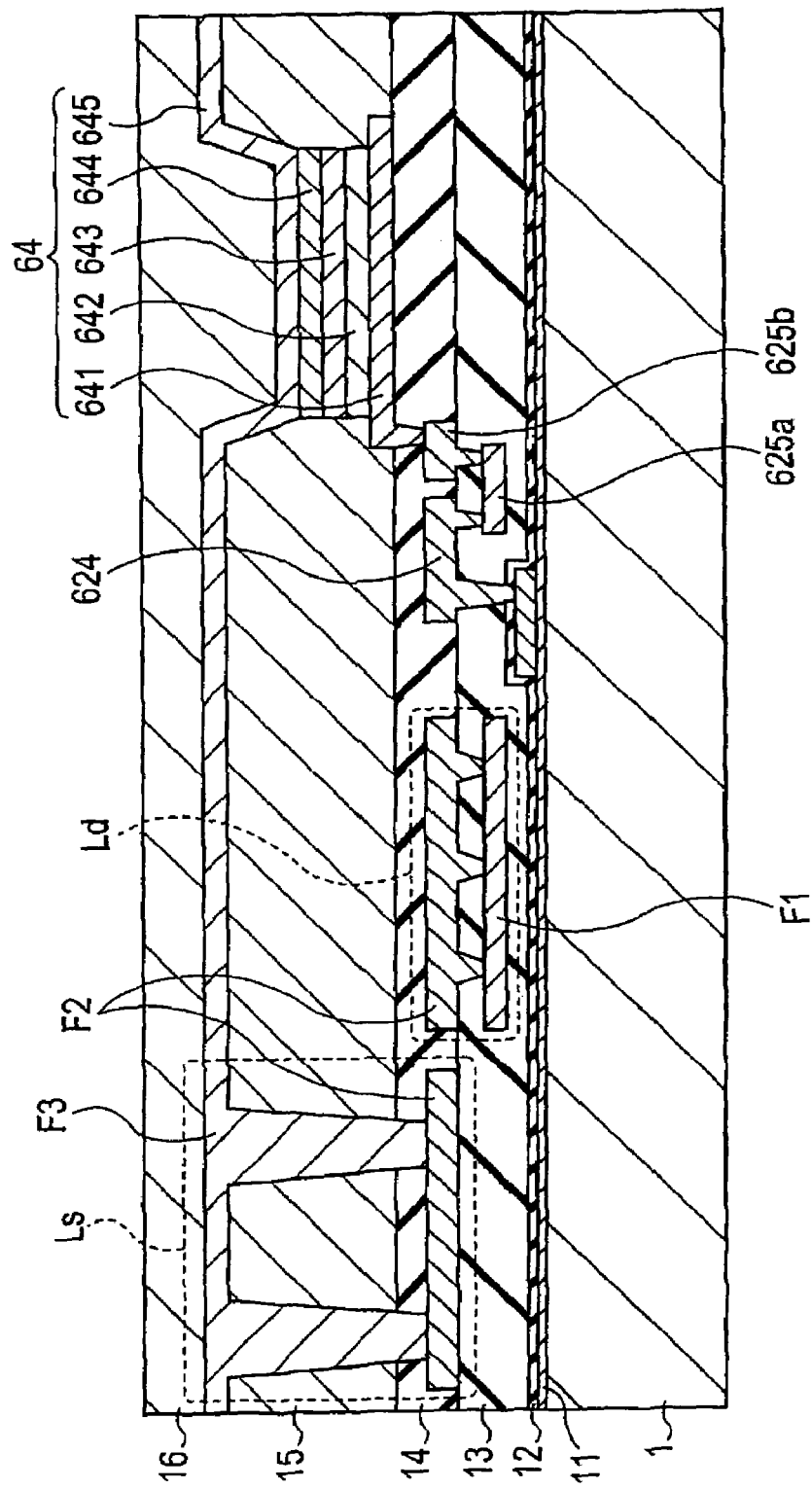
FIG. 8 is a cross-sectional view taken along the line Z2-Z2' of FIG. 6.

FIG. 8 is a cross-sectional view taken along the line Z2-Z2' of FIG. 6. As shown in FIG. 8, the first power line Ld has a first layer line F1 and a second layer line F2, which are connected to each other via a contact hole. In addition, the second power line Ls has the second layer line F2 and a third layer line F3, which are connected to each other via a contact hole. Here, the first layer line F1 corresponds to the layer that forms the gate electrode of each of the holding transistor 61 and the driving transistor 62. Also, the second layer line F2 corresponds to the layer that forms the source/drain electrode of each of the holding transistor 61 and the driving transistor 62. The third layer line F3 corresponds to the cathode 645 of the OLED element 64. The partition wall 15 is provided between the second layer line F2 and the third layer line F3 and serves as the second interlayer insulating layer that electrically isolates the second layer line F2 from the third layer line F3. The first layer line F1 and the second layer line F2 are formed at the same time when the transistors such as the holding transistor 61 and the driving transistor 62 are formed. The third layer line F3 is formed at the same time when the OLED element 64 is formed. In such a manner, when the first power line Ld and the second power line Ls have the laminated structure, the impedance of the power line can be reduced, and the first power supply voltage signal VDDEL and the second power supply voltage signal VSSEL can be stably supplied. Here, the second layer line F2 is used for both the first power line Ld and the second power line Ls. Therefore, since the first layer line F1, the second layer line F2, and the third layer line F3 are formed at the same time when the transistors and the OLED element 64 are formed, the first power line Ld and the second power line Ls have the laminated structure of two line layers without increasing the number of processes. Accordingly, since it is unnecessary to provide an additional layer to form the power line as the laminated structure, the structure can be simplified. Further, the layer corresponding to the anode 641 of the OLED element 64 may be laminated on the second power line Ls. As such, the impedance of the power line can be further reduced.

Figure 11:
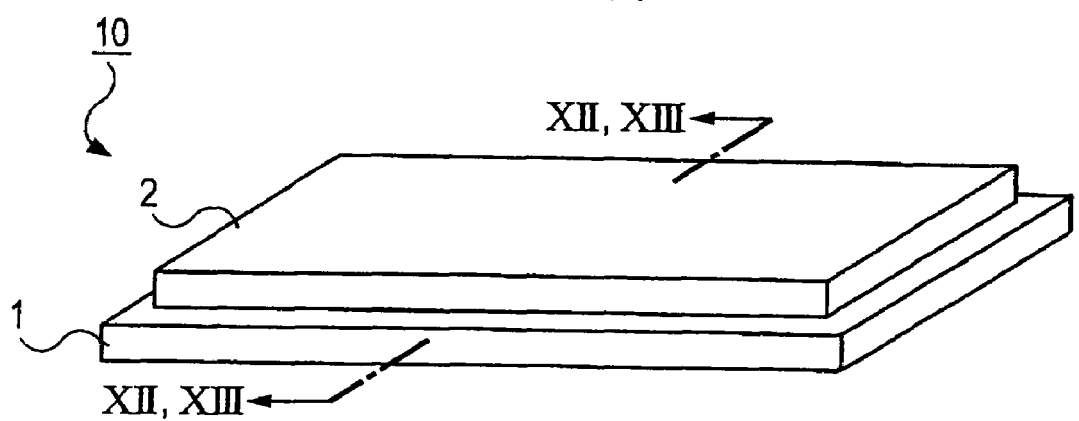
FIG. 11 is a perspective view showing an exterior configuration of a light-emitting device.
Figure 12:
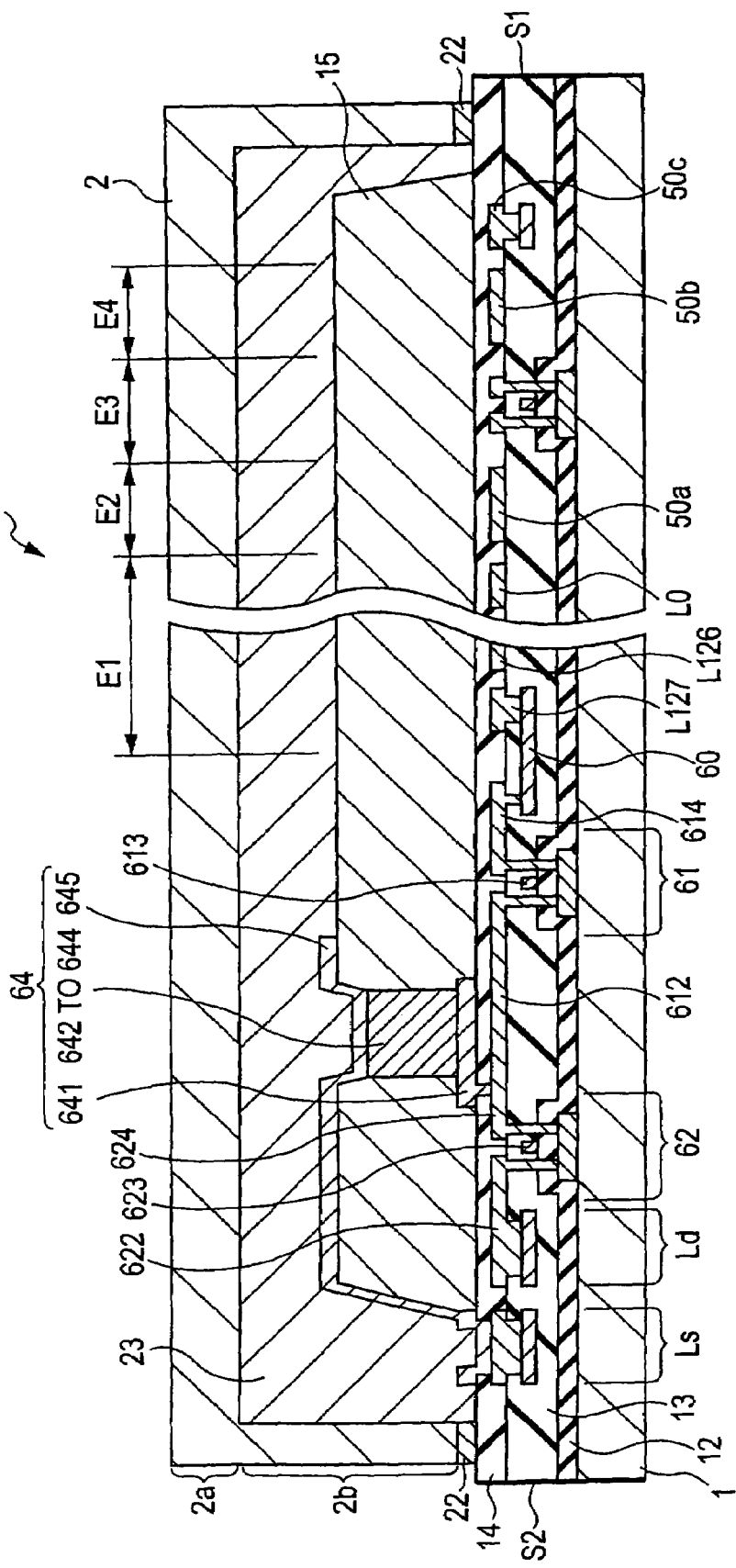
FIG. 12 is a cross-sectional view showing an example of a cross-section of the light-emitting device taken along the line S-S' of FIG. 11.

FIG. 11 shows an exterior configuration of the head unit 10. In this example, the head unit 10 (light-emitting device) has a substrate 1 and a sealing member 2 formed on the substrate 1. FIG. 12 is a cross-sectional view showing an example of a cross-section of the head unit 10 taken along the line S-S' of FIG. 11. The data lines L0 to L127 are formed in a region E1 shown in FIG. 12. The wiring line 50*a* for supplying the low-potential-side power supply voltage signal VLL is formed in a region E2. A data line driving circuit 50 is formed in a region E3. The wiring line 50*b* for supplying the high-potential-side power supply voltage signal VHH is formed in a region E4.

As shown in FIG. 12, the substrate 1 has a first end surface S1 and a second end surface S2. In addition, the data line driving circuit 50, the data lines L0 to L127, the holding transistors 61, the OLED elements 64, the driving transistors 62, the power line Ld, and the power line Ls are sequentially arranged on the substrate 1 between the first end surface S1 and the second end surface S2. In addition, the sealing member 2 is connected to the substrate 1 so as to cover the data line driving circuit 50, the data lines L0 to L127, the holding transistors 61, the OLED elements 64, the driving transistors 62, the power line Ld, and the power line Ls. As shown in FIG. 12, the sealing member 2 has a plate portion 2*a* and a frame portion 2*b*. The plate portion 2*a* is formed at a position facing the OLED element and the like formed on the substrate 1. The frame portion 2*b* is bonded to the substrate 1 via an adhesive 22. In addition, the substrate 1 is bonded to the sealing member 2 via only the frame portion 2*b* and a sealed space 23 is defined between the OLED element 64 provided on the substrate 1 and the plate portion 2*a*. In the sealed space 23, an inert gas such as dry nitrogen, or a liquid is sealed in order to prevent the light-emitting layer 60 or the cathode 645 from deteriorating due to oxygen or moisture. In addition, a desiccant agent or the like may be disposed in the sealed space 23. In this example, a so-called can sealing structure is used. Alternatively, a thin film sealing structure or a substrate bonding sealing structure may be employed. In the thin film sealing structure, as the sealing member 2, for example, a thin film made of silicon oxide, silicon nitride, or the like may be formed on the OLED element 64 by a chemical vapor deposition (CVD) method. In the substrate bonding sealing structure, for example, the substrate 1 may be bonded to a substrate, such as glass, as the sealing member 2 via an adhesive applied on the OLED element 64. Here, the substrate 1 is bonded to the sealing member 2 in a portion where an organic material such as the partition wall 15 or the like is not formed. In such a manner, oxygen or moisture from the exterior can be prevented from penetrating into the sealed space.

The light-emitting layer 643 of the OLED element 64 is made of a light-emitting material such as a conductive polymer or monomer. The light-emitting material is apt to be oxidized. Thus, when the light-emitting material is exposed to oxygen, the characteristics thereof deteriorate. In addition, as a material of the cathode 645, a material having a low work function is selected for the electron injection. Since such a material includes, for example, calcium or the like, a hydroxide film is apt to be formed as calcium reacts to moisture from the exterior. When the hydroxide film is formed, there is a difficulty in injecting electrons.

The sealing member 2 serves to protect the internal configuration from external air and has a function of blocking gas. However, in the case of the can sealing structure or the substrate bonding sealing structure, some gas, but a small amount, may penetrate from the adhesive bonding the sealing member 2 to the substrate 1 into the inside. In addition, in the case of the thin film sealing structure, some gas, but a small amount, may penetrate from a bonding surface between the sealing member 2 and the substrate 1 into the inside. For this reason, the OLED element 64 and the cathode 641, which are susceptible to gas, are preferably arranged as far as possible from the first and second end surfaces S1 and S2 of the substrate 1.

In the arrangement of FIG. 12, the OLED element 64 is provided between the holding transistor 61 and the driving transistor 62. Further, the data lines L0 to L127 and the data line driving circuit 50 are arranged between the holding transistor 61 and the first end surface S1. In addition, the power lines Ld and Ls are arranged between the driving transistor 62 and the second end surface S2. Accordingly, the OLED element 64 can be disposed near the center of the substrate 1. As a result, reliability can be enhanced.

In addition, since the cathode 645 is not arranged on the holding transistor 61 and the regions E1 to E4, the cathode 645 is hardly affected by the gas penetrating from the first end surface S1. Accordingly, the characteristic deterioration of the cathode 645 can be reduced and thus the reliability can be enhanced.

Figure 13:
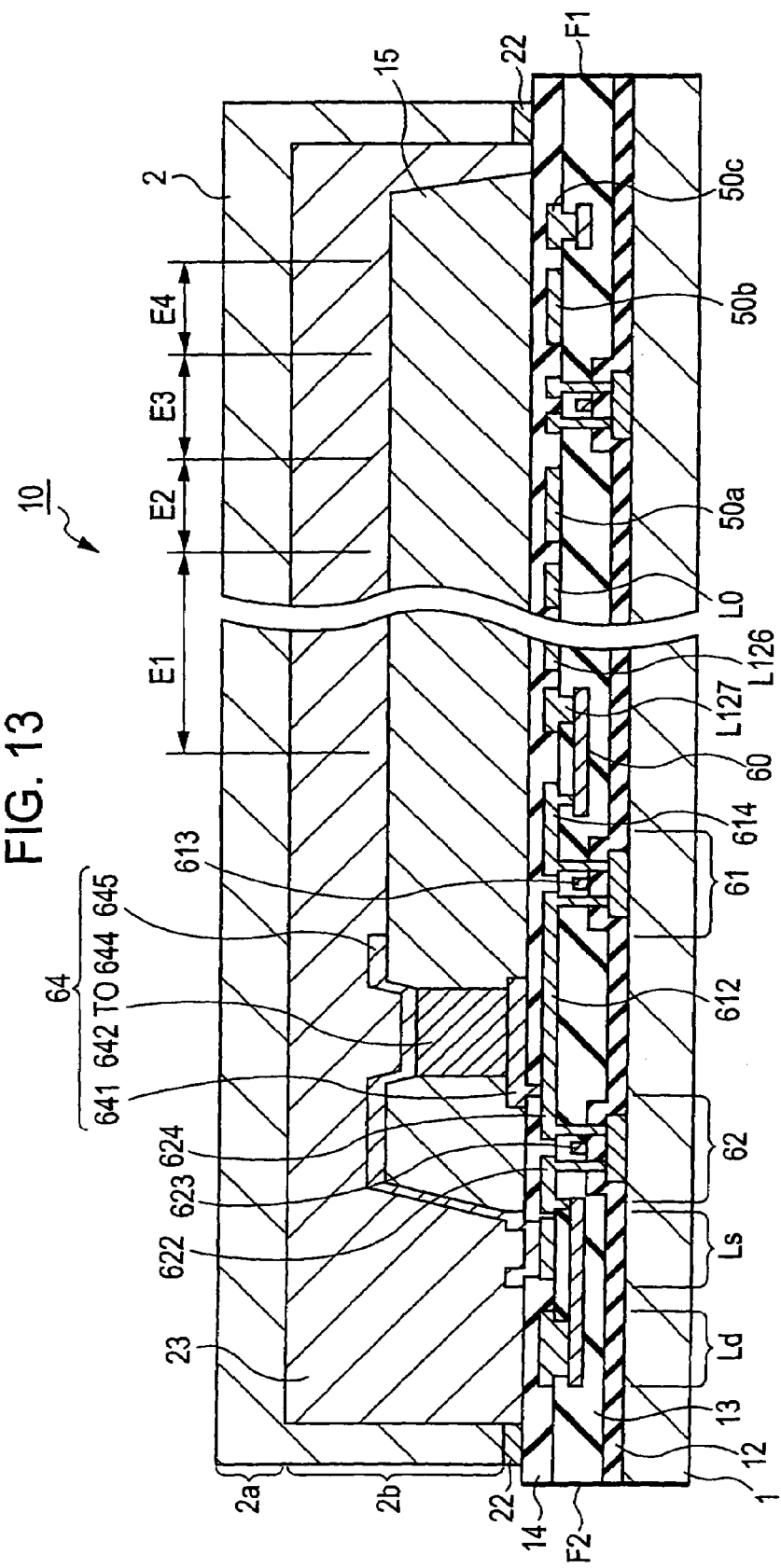
FIG. 13 is a cross-sectional view showing another example of a cross-section of the light-emitting device taken along the line S-S' of FIG. 11.

FIG. 13 is a cross-sectional view showing another example of a cross-section of the head unit 10 taken along the line S-S' of FIG. 11. This example is different from the example of FIG. 12 in that the arrangement of the power line Ls and power line Ld is inverted. That is, the power line Ls connected to the cathode 645 is arranged at a position further apart from the second end surface S2 than the power line Ld. In this case, the power line Ld is connected to the drain electrode 622 of the driving transistor 62 via the gate wiring line. With this arrangement, the cathode 645 is hardly affected by the gas penetrating from the second end surface S2. Accordingly, the characteristic deterioration of the cathode 645 is reduced and thus the reliability can be enhanced.

Image Forming Apparatus

Figure 9:
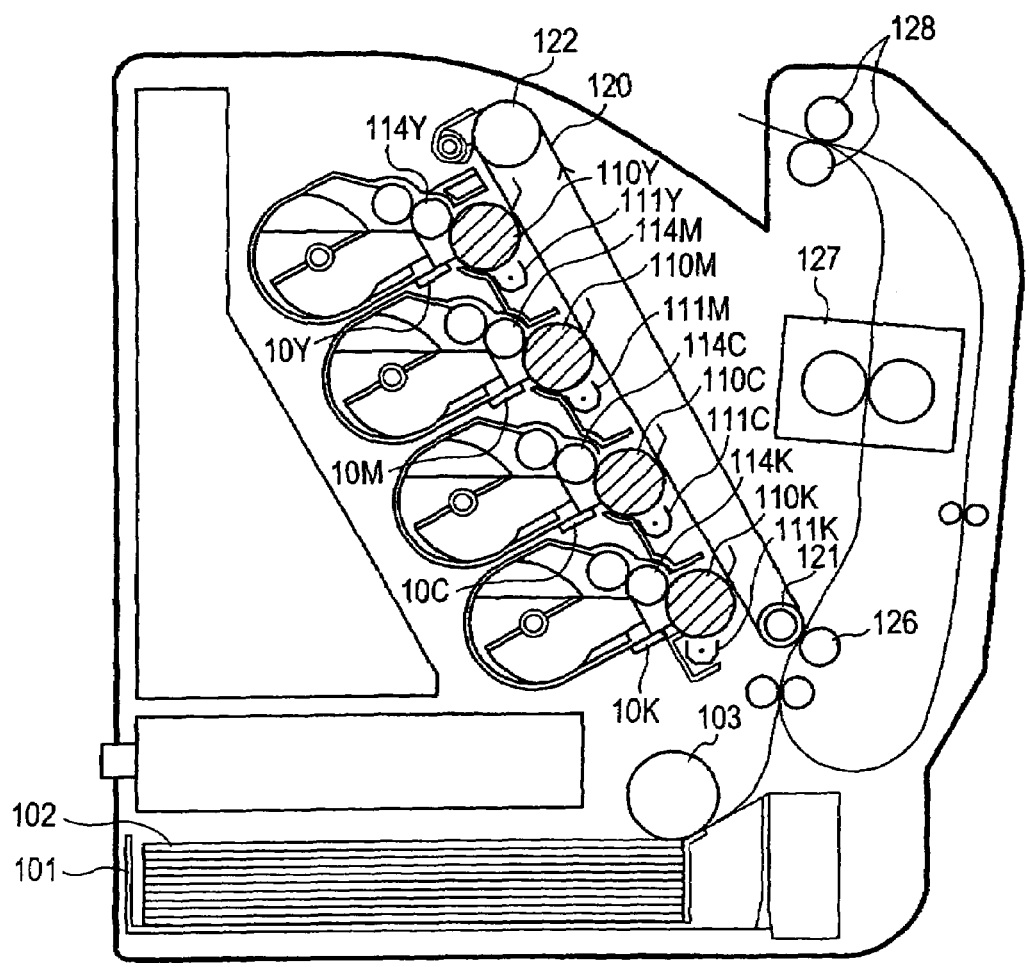
FIG. 9 is a longitudinal side view showing an example of an image forming apparatus.

FIG. 9 is a longitudinal side view showing an example of an image forming apparatus using the above-described head unit 10. The image forming apparatus is a tandem-type image forming apparatus in which four organic EL array exposure heads 10K, 10C, 10M, and 10Y having the same configuration are arranged at exposure positions of four corresponding photoreceptors (image carriers) 110K, 110C, 110M, and 110Y having the same configuration. Each of the organic EL array exposure heads 10K, 10C, 10M, and 10Y has the above-described head unit 10.

As shown in FIG. 9, the image forming apparatus is equipped with a driving roller 121, a driven roller 122, and an intermediate transfer belt 120 which is circularly driven in an arrow direction shown in FIG. 9. The photoreceptors 110K, 110C, 110M, and 110Y having photosensitive layers on their outer circumference surfaces are arranged as four image carriers arranged at predetermined intervals with respect to the intermediate transfer belt 120. Symbols K, C, M, and Y in the reference numerals means black, cyan, magenta, and yellow, respectively, and represent that the photoreceptors are used for black, cyan, magenta, and yellow, respectively. The same is applied to other members. The photoreceptors 110K, 110C, 110M, and 110Y rotate in synchronization with the driving of the intermediate transfer belt 120.

Around each photoreceptor 110K, 110C, 110M, or 110Y, an electrifying unit (corona electrifier) 111K, 111C, 111M, or 111Y for uniformly electrifying the circumference of the photoreceptor 110K, 110C, 110M, or 110Y. Then, the above-described organic EL array exposure head 110K, 110C, 110M, or 110Y for sequentially line-scanning the circumference uniformly electrified by the electrifying unit 111K, 111C, 111M, or 111Y in synchronization with the rotation of the photoreceptor 110K, 110C, 110M, or 110Y is provided.

Further, around each photoreceptor 110K, 110C, 110M, or 110Y, a developing device 114K, 114, 114M, or 114Y for applying a toner as a developing agent to an electrostatic latent image formed by the organic EL array exposure head 10K, 10C, 10M, or 10Y so as to form a visible image (a toner image) is also provided.

Here, the organic EL array exposure head 10K, 10C, 10M, or 10Y is provided such that an array direction of the organic EL array exposure heads 10K, 10C, 10M, and 10Y follows a generatrix of the photoreceptors 110K, 110C, 110M, and 110Y. In addition, a peak wavelength of light-emitting energy of each organic EL array exposure head 10K, 10C, 10M, or 10Y is set to be substantially equal to a peak wavelength of sensitivity of the corresponding photoreceptor 110K, 110C, 110M, or 110Y.

The developing device 114K, 114C, 114M, or 114Y uses, for example, a nonmagnetic one-component toner as the developing agent. The nonmagnetic one-component toner is transferred, for example, to a developing roller by a supply roller and the film thickness of the developing agent attached to a surface of the developing roller is regulated by a regulating blade. Then, the developing roller comes in contact with or is pressed on the photoreceptor 110K, 110C, 110M, or 110Y. The developing agent is attached to the photoreceptor 110K, 110C, 110M, or 110Y according to on a potential level of the photoreceptor 110K, 110C, 110M, or 110Y. As a result, the toner image is formed.

The toner images of black, cyan, magenta, and yellow formed by four mono toner image forming stations are primarily transferred to and sequentially overlap the intermediate transfer belt 120 to implement full color. A printing medium 102 fed one by one from a feed cassette 101 is sent to a secondary transfer roller 126 by a pick-up roller 103. The toner images on the intermediate transfer belt 120 are secondarily transferred to the printing medium 102, such as a paper, in the secondary transfer roller 126, and then are fixed on the printing medium 102 while passing through a pair of fusing rollers 127 as fusing units. Then, the printing medium 102 is discharged by a pair of discharging rollers 128 to a discharge tray which is provided in the upper portion of the image forming apparatus.

In such a manner, since the image forming apparatus of FIG. 9 uses the organic EL array as a writing unit, the apparatus can be further miniaturized, as compared to an image forming apparatus using a laser scanning optical system.

Next, an image forming apparatus according to another embodiment of the present invention will be described.

Figure 10:
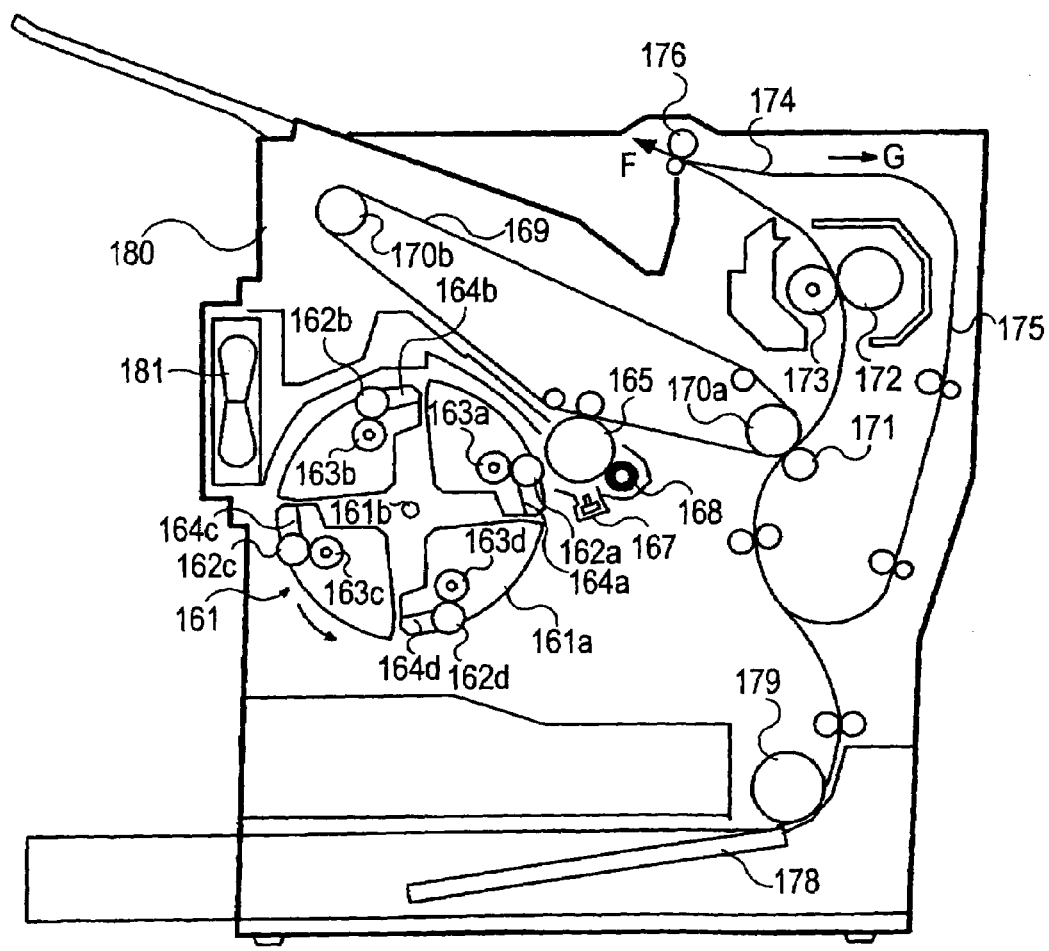
FIG. 10 is a longitudinal side view showing another example of an image forming apparatus.

FIG. 10 is a longitudinal side view of the image forming apparatus. In FIG. 10, the image forming apparatus has, as essential parts, a rotary-type developing device 161, a photoreceptor drum 165 serving as an image carrier, an exposure head 167 in which the organic EL array is provided, an intermediate transfer belt 169, a paper conveying path 174, a heating roller 172 of a fixer, and a feed tray 178. The exposure head 167 has the above-described head unit 10.

A developing rotary 161a of the developing device 161 rotates in a counterclockwise direction around a shaft 161b. The inside of the developing rotary 161a is divided into four parts in which four color image forming units of yellow (Y), cyan (C), magenta (M), and black (K) are provided respectively. Developing rollers 162a to 162d and toner supply rollers 163a to 163d are respectively arranged in the four color image forming units. In addition, the toners are regulated to a predetermined thickness by regulating blades 164a to 164d.

The photoreceptor drum 165 is electrified by an electrifier 168 and is driven in a direction opposite to the developing roller 162a by a driving motor (not shown), for example, a stepping motor. The intermediate transfer belt 169 is suspended between a driven roller 170b and a driving roller 170a. The driving roller 170a is connected to the driving motor of the photoreceptor drum 165 and transfers power to the intermediate transfer belt. The driving roller 170a of the intermediate transfer belt 169 rotates in a direction opposite to the photoreceptor drum 165 when the driving motor is driven.

On the paper conveying path 174, a plurality of conveying rollers, a pair of paper discharging rollers 176 and so on are provided for conveying a paper. One-sided image (toner image) carried on the intermediate transfer belt 169 is transferred on one side of a paper at a position of the secondary transfer roller 171. The secondary transfer roller 171 is separated from or comes in contact with the intermediate transfer belt 169 by a clutch. When the clutch is turned on, the secondary transfer roller 117 comes in contact with the intermediate transfer belt 169 and transfers the image on the paper.

Next, the paper having the image transferred thereon is fixed by the fixer having a fixing heater. The fixer is equipped with the heating roller 172 and a pressing roller 173. After the fixing process has been completed, the paper is drawn between the pair of paper discharging rollers 176 and travels in an arrow direction F. Under this condition, when the pair of paper discharging rollers 176 rotate in an inversion direction, the traveling direction of paper is inverted and then the paper travels in an arrow direction G along a conveying path 175 for both-sided printing. The paper is drawn out of the feed tray 178 one by one by a pick up roller 179.

In the paper conveying path, for example, a low speed brushless motor is used as the driving motor for driving a conveying roller. In addition, since color difference correction and the like are required, a stepping motor is used for the intermediate transfer belt 169. Each motor is controlled by a signal from a control unit (not shown).

In the state shown in FIG. 10, a yellow (Y) electrostatic latent image is formed on the photoreceptor drum 165 and thus a yellow image is formed on the photoreceptor drum 165 when a high voltage is applied to a developing roller 128*a*. If both front- and rear-side yellow images are carried on the intermediate transfer belt 169, the developing rotary 161*a* rotates by an angle of 90 degrees.

The intermediate transfer belt 169 returns to the position of the photoreceptor drum 165 whenever the intermediate transfer belt 169 rotates. Next, two-sided cyan (C) images are formed on the photoreceptor drum 165 and are carried on the intermediate transfer belt 169 such that the cyan images overlap the yellow images already carried on the intermediate transfer belt 169. Then, similarly, the developing rotary 161 rotates by 90 degrees, the images are carried on the intermediate transfer belt 169, and then the developing rotary 161*a* rotates one time. The processes are repeatedly performed.

In order to carry four color images, first, the intermediate transfer belt 169 is rotated four times. Then, a rotational position thereof is controlled and the image is transferred on the paper at a position of the second transfer roller 171. The paper fed from the feed tray 178 is conveyed to the conveying path 174 and the color image is transferred on one side of the paper at the position of the secondary transfer roller 171. The paper, one side of which has the transferred image, is inverted by the pair of paper discharging rollers 176 and waits on the conveying path. Thereafter, the paper is conveyed to the position of the secondary transfer roller 171 at a proper timing, such that the color image is transferred on the other side of the paper. An exhaust fan 181 is provided in a housing 180.

What is claimed is:

1. A light-emitting device comprising:
    a light-emitting element including a first electrode, a second electrode, and a light-emitting layer interposed between the first electrode and the second electrode;
    a driving transistor that drives the light-emitting element, the driving transistor including a gate terminal;
    a first-electrode power line coupled to the first electrode through the driving transistor;
    a second-electrode power line coupled to the second electrode; and
    a gate wiring line formed in the same layer as the gate terminal of the driving transistor, the gate wiring line being coupled to the first-electrode power line, at least a part of the gate wiring line overlapping the second-electrode power line.

2. The light-emitting device according to claim 1, the first electrode being an anode of the light-emitting element and the second electrode being a cathode of the light-emitting element.

* * * * *